United States Patent
Lee et al.

(10) Patent No.: US 7,998,767 B2
(45) Date of Patent: Aug. 16, 2011

(54) METHOD FOR MANUFACTURING A FACET EXTRACTION LED

(75) Inventors: Tae Won Lee, Seoul (KR); Hee Seok Park, Gyunggi-Do (KR); Masayoshi Koike, Gyunggi-Do (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/704,570

(22) Filed: Feb. 12, 2010

(65) Prior Publication Data

US 2010/0210051 A1    Aug. 19, 2010

Related U.S. Application Data

(62) Division of application No. 11/707,062, filed on Feb. 16, 2007, now Pat. No. 7,683,385.

(30) Foreign Application Priority Data

Feb. 16, 2006 (KR) .................. 10-2006-0015274

(51) Int. Cl.
*H01L 21/00* (2006.01)
(52) U.S. Cl. .................. 438/29; 438/30; 257/94
(58) Field of Classification Search .............. 438/29, 438/30; 257/94, E33.005
See application file for complete search history.

(56) References Cited

U.S. PATENT DOCUMENTS

| 5,751,021 | A | 5/1998 | Teraguchi |
| 6,134,458 | A | 10/2000 | Rosenthal |
| 6,834,981 | B2 | 12/2004 | Nagai et al. |
| 6,857,762 | B2 | 2/2005 | Shimokawa et al. |
| 7,087,985 | B2 * | 8/2006 | Park et al. ............ 257/676 |
| 7,247,985 | B2 * | 7/2007 | Kaneko et al. ........ 313/506 |
| 7,436,066 | B2 | 10/2008 | Sonobe et al. |
| 2006/0108593 | A1 | 5/2006 | Kim et al. |

FOREIGN PATENT DOCUMENTS

| JP | 07-183573 | 7/1995 |
| JP | 2004-079785 | 3/2004 |
| JP | 2005-302803 | 10/2005 |
| KR | 10-2004-0050733 | 6/2004 |

OTHER PUBLICATIONS

Japanese Office Action, w/ English translation thereof, issued in Japanese Patent Application No. JP 2007-033521 dated Sep. 28, 2010.
Japanese Office Action, with English translation, issued in Japanese Patent Application No. 2007-033521, mailed Feb. 22, 2011.

* cited by examiner

*Primary Examiner* — Phuc T Dang
(74) *Attorney, Agent, or Firm* — McDermott Will & Emery LLP

(57) ABSTRACT

A facet extraction LED improved in light extraction efficiency and a manufacturing method thereof. A substrate is provided. A light emitting part includes an n-type semiconductor layer, an active layer and a p-type semiconductor layer sequentially stacked on the substrate. A p-electrode and an n-electrode are connected to the p-type semiconductor layer and the n-type semiconductor layer, respectively. The p- and n-electrodes are formed on the same side of the LED. The light emitting part is structured as a ring.

9 Claims, 10 Drawing Sheets

(a)

(b)

METHOD FOR MANUFACTURING A FACET EXTRACTION LED

RELATED APPLICATIONS

This application is a Divisional of U.S. application Ser. No. 11/707,062, filed on Feb. 16, 2007 U.S. Pat. No. 7,683,385, claiming priority of Korean Patent Application No. 2006-0015274, filed on Feb. 16, 2006, the entire contents of each of which are hereby incorporated by reference.

BACKGROUND OF THE INVENTION

1. Field of the Invention

The present invention relates to a light emitting diode, and more particularly, to a facet extraction light emitting diode (LED) having a high light emitting efficiency, and a manufacturing method thereof.

2. Description of the Related Art

Recently, a light emitting diode (LED) utilizing a group III-V or group II-VI compound semiconductor material is largely used in a light emitting device for producing visible light. Also, such an LED is adopted for a light source of various products such as lightening boards, lightening devices, and LCD backlights. In a method to manufacture the semiconductor LED, an n-type semiconductor layer, an active layer and a p-type semiconductor layer are sequentially grown on a substrate to form a light emitting structure.

The typical semiconductor LED is structured to extract light from upper or lower surfaces but not a plane surface, i.e., a facet. However, the LED cannot exceed 15% in its light extraction efficiency without a separate technique such as photonic crystal, which, even if adopted, yields merely about 30% light extraction efficiency. Such low light extraction efficiency is attributed to light absorption in a crystal and light loss at an electrode as well.

As an alternative structure, a facet extraction LED has been proposed. The facet extraction LED is structured to extract light from a facet where the active layer is exposed. Here, a plurality of the facet extraction LED can be arranged to manufacture a smaller surface light source device. The facet extraction LED may be configured as a Separate Confinement Heterostructure (SCH) to trap light around the active layer. Yet, in the facet extraction LED, a light extraction face is smaller than other faces and thus travels a long distance in a crystal before being extracted. This increases light loss in the crystal and reduces light extraction amount, thereby lowering light extraction efficiency to 2% or less.

FIG. 1 is a perspective view illustrating a conventional facet extraction LED. Referring to FIG. 1, the facet extraction LED 10 includes an n-type semiconductor 13, an active layer 15 and a p-type semiconductor layer 17 sequentially formed on a conductive substrate 11. The n- and p-type semiconductor layers 13 and 17, and the active layer 15 constitute a light emitting structure. A p-electrode 18 is formed on the p-type semiconductor layer 17 and an n-electrode 19 is formed underneath the conductive substrate 11.

As shown in FIG. 1, light is extracted and emitted from a facet A where the active layer 15 is exposed. The facet A, if the greater amount of light is extracted therefrom than from other faces, serves as a light extraction face. However, the facet A for extracting light is smaller than other faces such as an facet B, upper or lower surface. That is, a width W of the light extraction face A along a plane direction of the active layer is smaller than a distance L between the light extraction face A and its opposing face. This causes light to propagate a longer distance in a crystal before being extracted outside the LED, thereby resulting in considerable light loss in the crystal.

After all, the conventional facet extraction LED 10 fails to assure sufficient light extraction efficiency or light emitting efficiency. Further, the surface light source device such as the LCD backlight manufactured using a plurality of the facet extraction LED suitably serves to miniaturize a product, however, without exhibiting sufficient brightness due to degraded efficiency of the LED 10. This as a result calls for the facet extraction LED improved in light extraction efficiency more significantly.

SUMMARY OF THE INVENTION

The present invention has been made to solve the foregoing problems of the prior art and therefore an aspect of the present invention is to provide a facet extraction light emitting diode (LED) having light extraction efficiency.

Another aspect of the invention is to provide a facet extraction LED improved in light extraction efficiency, and a manufacturing method thereof.

According to an aspect of the invention, the facet extraction LED includes a substrate; a light emitting stack including an n-type semiconductor layer, an active layer and a p-type semiconductor layer sequentially stacked on the substrate; and a p-electrode and an n-electrode connected to the p-type semiconductor layer and the n-type semiconductor layer, respectively, the p- and n-electrodes formed on the same side of the LED, wherein the light emitting stack comprises a ring structure. The ring structure has outer and inner facets crossing the active layer, the outer facet extracting a greater amount of light than the inner facet. The active layer has a ring-shape in a plain view and is disposed in the ring structure in a plain view.

According to an embodiment of the invention, each of the n-type semiconductor layer, the active layer and the p-type semiconductor layer comprises a group III-V compound semiconductor material. For example, the semiconductor layers are made of a group III nitride-based semiconductor such as GaN.

According to a preferred embodiment of the invention, the light emitting diode further comprises an anti-reflection film formed on the outer facet of the ring structure. Preferably, the anti-reflection film has a reflectivity ranging from 0% to 5% with respect to light from the active layer.

According to another preferred embodiment of the invention, the facet extraction LED further includes a reflective film formed on an inner facet of the ring structure. Preferably, the reflective film has a reflectivity ranging from 90% to 100% with respect to light from the active layer. Preferably, the facet extraction LED includes both the anti-reflection film and the reflective film.

According to another embodiment of the invention, the ring structure has a circular outline. According to further another embodiment of the invention, the ring structure has a polygonal outline such as a hexagon or an octagon.

According to further another embodiment of the invention, the facet extraction LED comprises a flip-chip LED. Here, the p- and n-electrodes are bonded onto a submount for mounting the LED, e.g., a reflective cup of a package, by solder bumps.

The ring structure satisfies a following relationship:

$$5 \leq W/L \leq 10{,}000,$$

where L is a distance between the outer and inner facets, and W is an outer peripheral length of the active layer on the outer facet. Preferably, the distance L between the outer and inner facets of the ring structure ranges from 1 μm to 100 μm.

According to further another embodiment of the invention, the ring structure has protrusions and indentations on the outer facet. The outer facet with protrusions and indentations further enhances light extraction efficiency therefrom.

According to further another embodiment of the invention, the substrate comprises a sapphire substrate. According to further another embodiment of the invention, the substrate comprises a conductive substrate. For example, the conductive substrate is a GaN substrate or a SiC substrate.

According to further another preferred embodiment of the invention, the n-electrode is surrounded by the ring structure. Specifically, the n-electrode is disposed on the n-type semiconductor layer, surrounded by the ring structure. In a case where the substrate is a conductive substrate, the substrate comprises a conductive substrate, and the n-electrode surrounded by the ring structure is in direct contact with the substrate.

According to further another embodiment of the invention, the outer and inner facets of the ring structure are inclined with respect to a stacking direction of the semiconductor layers in such a fashion that a distance between the outer and inner facets increases toward the substrate.

According to further another embodiment of the invention, the n- and p-type semiconductor layers and the active layer comprise a separate confinement heterostructure. This SCH structure traps light around the active layer, reducing light loss at the electrodes.

According to another aspect of the invention, the method for manufacturing the facet extraction LED includes:

sequentially forming an n-type semiconductor layer, an active layer and a p-type semiconductor layer on a substrate;

forming a p-electrode with a ring pattern on the p-type semiconductor layer;

selectively etching the p-type semiconductor layer, the active layer and the n-type semiconductor layer to form a light emitting part of a ring structure under the p-electrode; and forming an n-electrode to be surrounded by the light emitting part.

According to an embodiment of the invention, the step of forming the light emitting part of the ring structure includes partially etching a portion of the n-type semiconductor layer, in a thickness direction, in such a fashion that a remaining portion of the etched n-type semiconductor layer portion is surrounded by the light emitting part.

According to further another embodiment of the invention, the substrate comprises a conductive substrate, and the step of forming the light emitting part of the ring structure includes entirely etching a portion of the n-type semiconductor layer, in a thickness direction, so that the portion of the n-type semiconductor layer is completely removed in a region surrounded by the light emitting part. Here, the n-electrode surrounded by the light emitting part is indirect contact with the substrate.

According to a preferred embodiment of the invention, the manufacturing method further includes forming an anti-reflection film on the outer facet of the ring structure. Also, the manufacturing method further includes forming a reflective film reflective film on the inner facet of the ring structure.

In this specification, 'a group III nitride semiconductor' designates a binary, ternary or quaternary compound semiconductor having a composition expressed by $Al_xGa_yIn_{(1-x-y)}N$, where $0 \leq x \leq 1$, $0 \leq y \leq 1$, and $0 \leq x+y \leq 1$.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings, in which preferred embodiments of the invention are shown. The invention may, however, be embodied in many different forms and should not be construed as limited to the embodiments set forth herein. Rather, these embodiments are provided so that this disclosure will be thorough and complete, and will fully convey the scope of the invention to those skilled in the art.

First Embodiment

Figure 2:
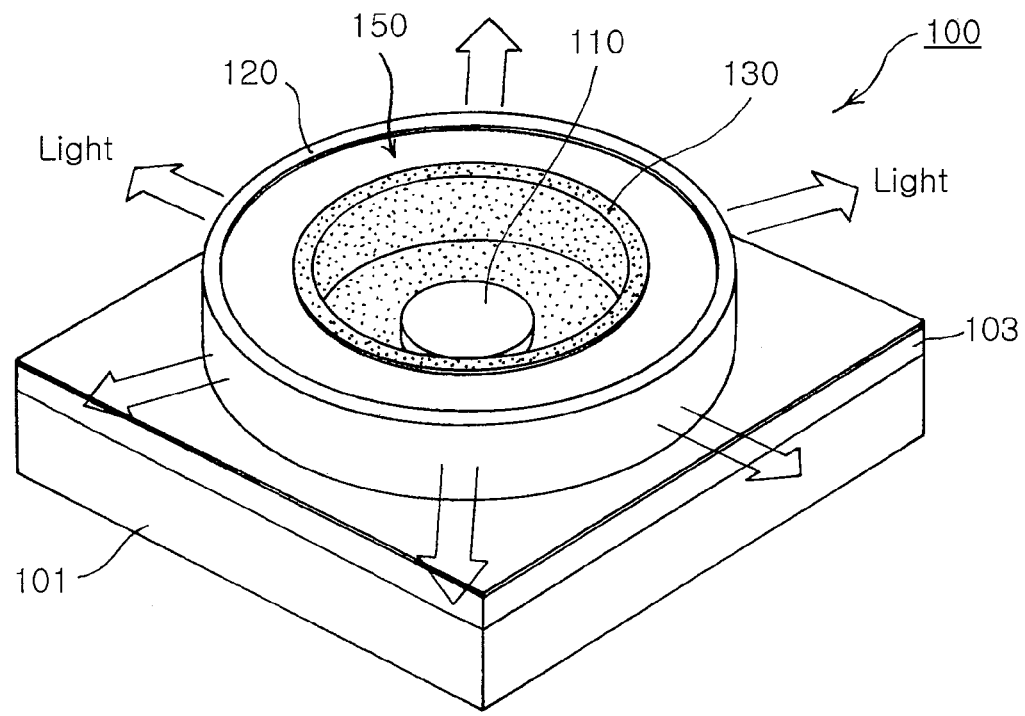
FIG. 2 is a perspective view illustrating a facet extraction LED according to a first embodiment of the invention.
Figure 3:
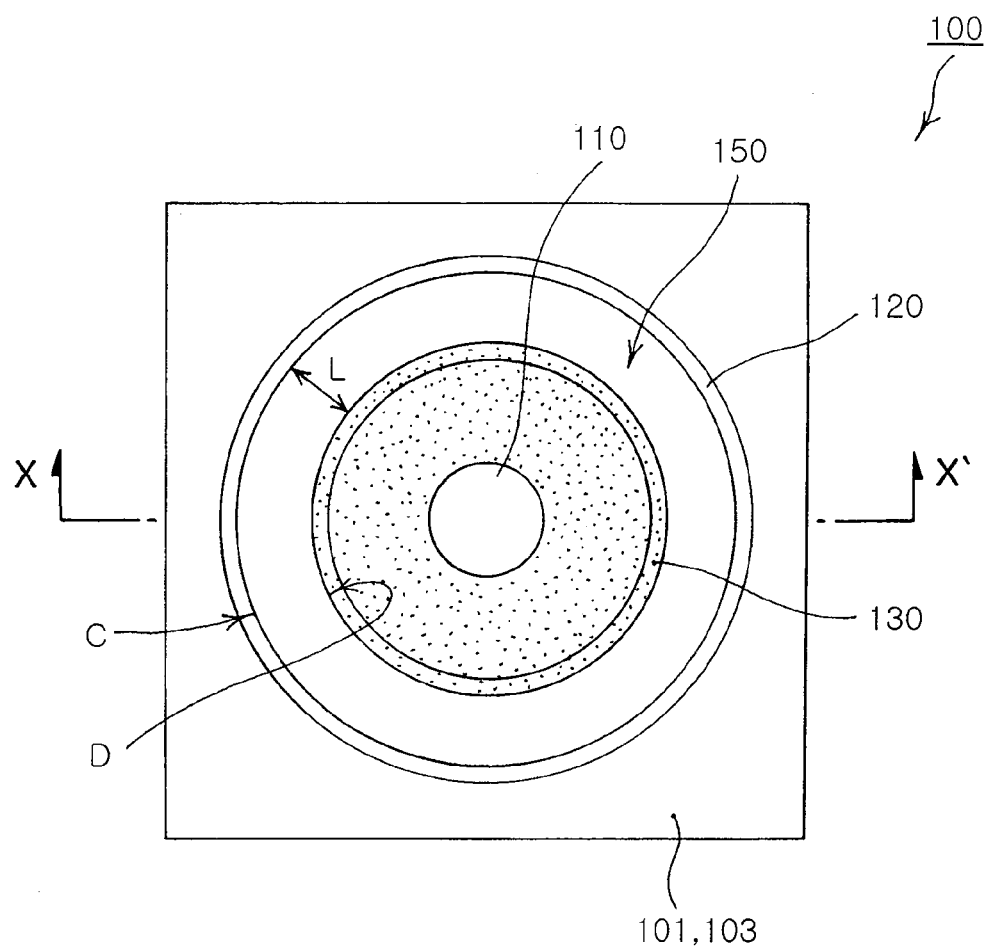
FIG. 3 is a plan view illustrating the facet extraction LED of FIG. 2.
Figure 4:
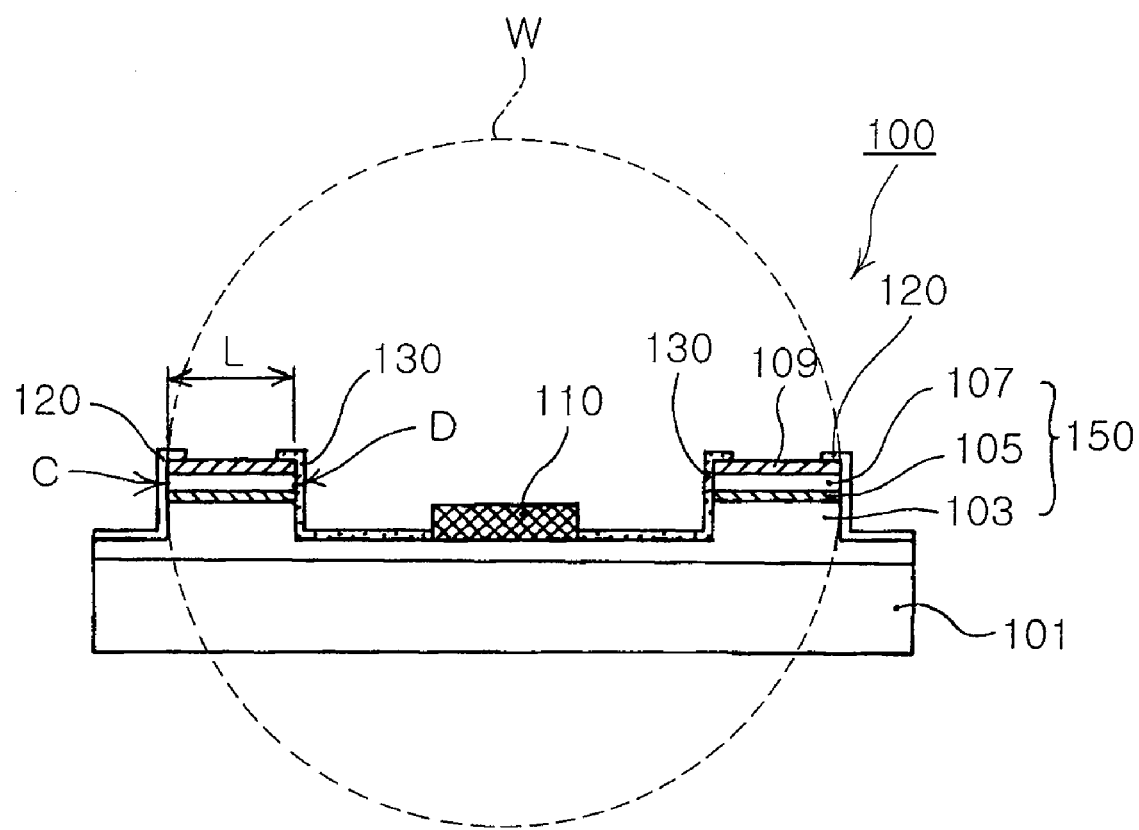
FIG. 4 is a side cross-sectional view illustrating a facet extraction LED cut along the line XX' of FIG. 3.

FIG. 2 is a perspective view illustrating a facet extraction light emitting diode (LED) according to a first embodiment of the invention. FIG. 3 is a plan view illustrating the facet extraction LED of FIG. 2. FIG. 4 is a side cross-sectional view cut along the line XX' of FIG. 3.

Referring to FIGS. 2 to 4, the facet extraction LED 100 includes an n-type semiconductor layer 103, an active layer 105 and a p-type semiconductor layer 107 sequentially grown on a substrate 101. The semiconductor layers 103, 105, and 107 may be made of a group III nitride semiconductor such as GaN. The substrate 101 may be a sapphire substrate or a conductive substrate of e.g. GaN and SiC. A p-electrode 109 is formed on the p-type semiconductor layer 107. The p-electrode 109 is not illustrated in FIGS. 2 and 3 for convenience's sake. The n- and p-type semiconductor layers 103 and 107 and the active layer are protruded from the substrate 101 to constitute a light emitting stack 150.

As shown in FIGS. 2 to 4, the light emitting stack 150 of the LED 100 features a ring structure. Especially, in this embodiment, the light emitting stack 150 is structured as a circular ring. An n-electrode 110 is surrounded by the light emitting stack 150 of the ring structure and formed on the n-type semiconductor layer 103. The p- and n-electrodes 109 and 110 of the LED 100 are formed to face the same direction, that is, formed on the same side of the LED 100. Accordingly the LED 100 is of a planar or lateral-electrode type.

An outer facet C of the ring-structured light emitting stack 150 extracts the greatest amount of light out of facets. The outer facet C of the light emitting stack 150 is larger than an inner facet D thereof, and thus serves as a major light extraction face. That is, light extraction amount from the outer facet C of the light emitting stack 150 is greater than that from the inner facet D thereof. This allows light generated from the active layer 105 to be chiefly extracted from the outer facet C (see FIG. 2). An anti-reflective film 120 is formed on the outer facet C by coating in order to further enhance light extraction efficiency. Also, a reflective film 130 is formed by coating on the inner facet D opposing the outer facet C, i.e., the major light extraction face to suppress light from being radiated from the inner facet D.

Figure 1:
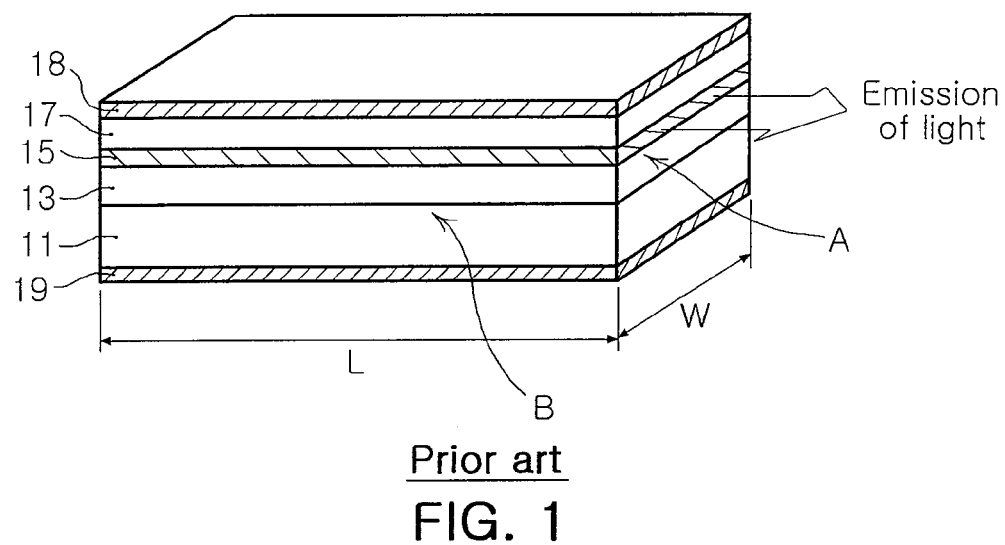
FIG. 1 is a perspective view illustrating a conventional facet extraction LED.

Referring to FIGS. 2 to 4, an outer peripheral length W (corresponding to the circumference of a dotted circle in FIG. 4) of the active layer on the outer facet, i.e., is bigger than a distance L between the outer facet C and its opposing face D. (compare with FIG. 1). In this fashion, the outer peripheral length W greater than the distance L enables the major light extraction face, i.e., outer facet C to be larger in size than the other facet D. This allows light to be extracted from the larger facet. Furthermore, due to the distance L smaller than the outer peripheral length W, light generated from the active layer 105 propagates a shorter distance in a crystal before being extracted from the outer facet C to the outside. This as a result diminishes multiple reflection and light loss in the crystal, thereby remarkably boosting light extraction efficiency and brightness.

To sufficiently shorten a light path in the crystal, a ratio of the outer peripheral length W to the distance L is preferably at least 5. For example, the outer peripheral length W is about 2500 μm and the distance L is about 50 μm. However, the distance L too smaller than the outer peripheral length W of a predetermined dimension renders the active layer 105 smaller-sized and poses difficulty to a technical process. Thus preferably, a ratio W/L of the outer peripheral length W to the distance L is not greater than 10,000. Preferably, the ratio W/L ranges from 10 to 10,000, and more preferably, 50 to 10,000. To more shorten the light path in the crystal, the ratio W/L may be at least 100.

In order to downscale the size of the facet extraction LED 100 and enlarge the ratio W/L, preferably, the distance L is 100 μm or less. Also, to assure a sufficient area of the active layer 105, the distance L is preferably at least 1 μm. Especially, the distance L may range from 1 μm to 50 μm. Moreover, the facet extraction LED can be reduced to an ultra-small size by setting the distance L in the range of 20 μm or less or 10 μm or less.

The anti-reflection film 120 restrains light incident from inside the crystal on the outer facet C from being reflected, thereby facilitating light extraction from the outer facet C. Therefore, desirably, the anti-reflection film 120 has a smaller reflectivity. Preferably, the anti-reflection film 120 has a reflectivity ranging from 0% to 5% with respect to light from the active layer 105.

The reflective film 130 suppresses light from being extracted from the inner facet D and reflects light incident on the inner facet D toward the outer facet C. In this embodiment, since the outer facet C is a major light extraction face, preferably light is not extracted from the other facet D. This is why a reflective film 130 with high reflectivity is formed on the inner facet D opposing the outer facet C. Therefore, desirably, the reflective film 130 has a greater reflectivity. Preferably, the reflective film 130 has a reflectivity ranging from 90% to 100% with respect to light from the active layer 105.

Figure 12:
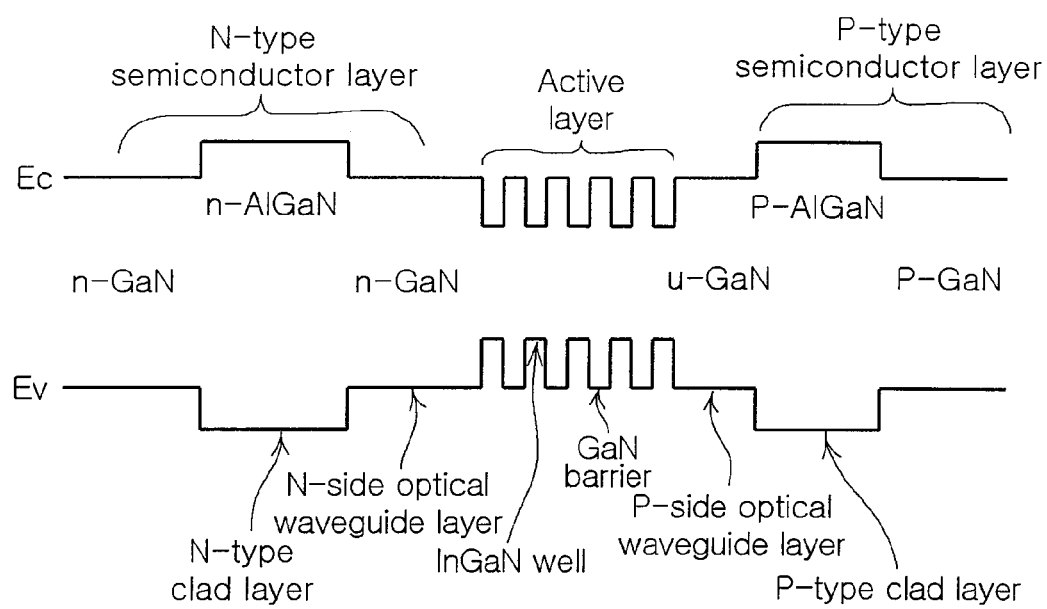
FIG. 12 is an energy band diagram illustrating a facet extraction LED according to further another embodiment of the invention.

Light loss occurring in the facet extraction LED 100 may result from light absorption and reflection in the p-electrode 109 or the substrate 101. To minimize such light loss, it is preferable to trap light around the active layer 105 as much as possible. To this end, desirably the semiconductor layers 103, 105 and 107 feature a Separate Confinement Heterostructure (SCH). This SCH structure has a stack of a low-reflectivity layer/a high-reflectivity layer/an active layer/a high-reflectivity layer/a low-reflectivity layer so that light can be trapped around the active layer effectively. FIG. 12 is an energy band diagram illustrating an exemplary SCH structure. In FIG. 12, 'Ec' denotes an edge of a conduction band and 'Ev' denotes an edge of a valence band.

Referring to FIG. 12, the active layer is sandwiched between p- and n-side optical waveguide layers, and the active layer and the optical waveguide layers are sandwiched between p- and n-type clad layers. As shown, the active layer may feature a multiple quantum well structure having GaN barriers and InGaN wells stacked alternately. The p- and n-type clad layers have a lower reflectivity than the optical waveguide layers. For example, the optical waveguide layers are made of GaN and the p- and n-type clad layers are made of AlGaN having a lower reflectivity and bigger band gap than GaN. The p-side optical waveguide layer may be made of undoped GaN (u-GaN) or p-doped GaN (p-GaN). This energy band structure of SCH can be employed to trap light around the active layer 105 effectively.

According to this embodiment, the outer facet C, i.e., the major light extraction face, is convex, thus effectively decreasing a total reflection ratio of light incident on the light extraction face. This decline in total reflection is manifested in FIG. 5.

Figure 5:
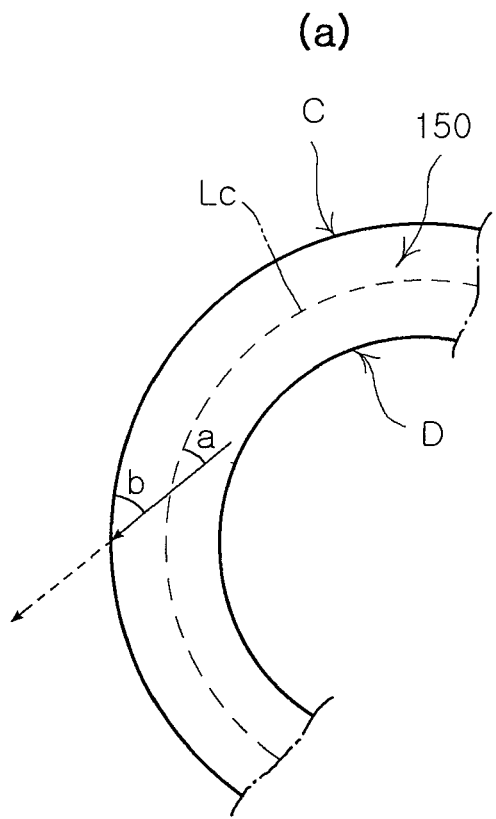
FIG. 5 is a partial plan view for explaining decrease in total reflection of the facet extraction LED shown in FIG. 2.
Figure 5:
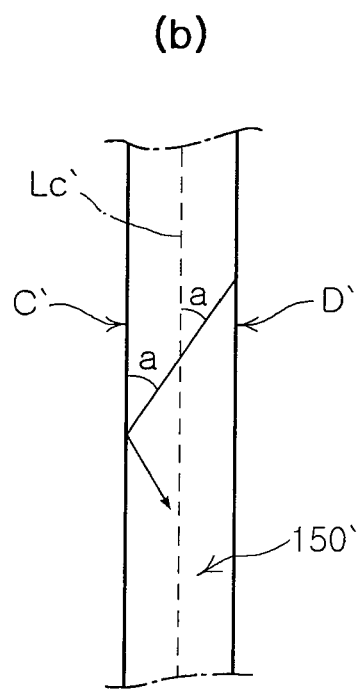

FIG. 5 (a) is a partial plan view illustrating a light emitting stack 150 of a ring structure. FIG. 5(b) is a partial plan view illustrating a comparative embodiment of the light emitting stack 150' of a linear structure. As shown in FIG. 5 (a), light traveling at an angle a with respect to a central line Lc of the light emitting stack 150 enters a concave outer facet C at a greater angle of b (b>a). This renders the light less likely to be total reflected on the outer facet C, thus increasing light extraction amount from the outer facet C.

However, as shown in FIG. 5 (b), in a case where the light emitting stack 150' is of a linear structure, light traveling at an angle a with respect to a central line Lc' of the light emitting stack 150' enters a facet C' at an angle identical to a. This does not lead to decrease in total reflection on the facet. Moreover a plane facet D' hardly reduces total reflection.

Second Embodiment

Figure 6:
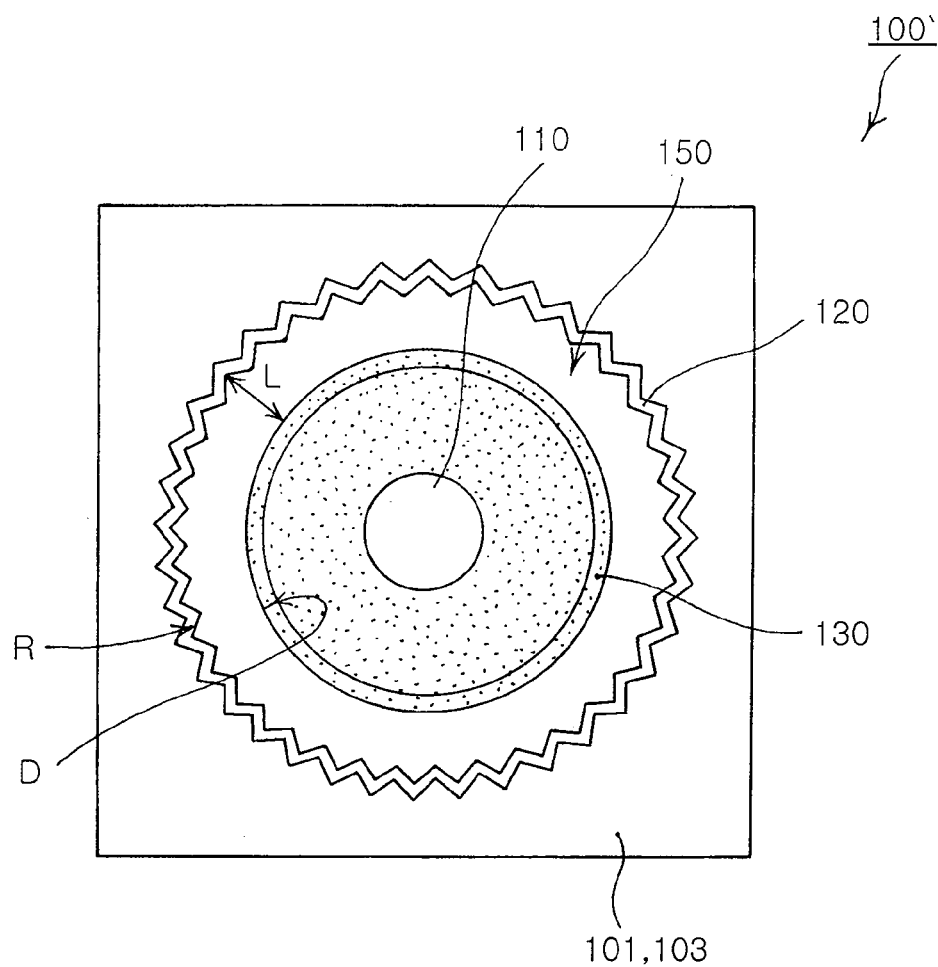
FIG. 6 is a plan view illustrating a facet extraction LED according to a second embodiment of the invention.

FIG. 6 is a plan view illustrating a facet extraction LED 100' according to a second embodiment of the invention. In this embodiment, the facet extraction LED has protrusions and indentions on a major light extraction face. As shown in FIG. 6, a light emitting part 150 of the facet extraction LED 100' features a ring structure, and has protrusions and indentions on an outer facet R of the ring structure. The protrusions and indentions on the outer facet R makes light incident on the outer facet R less likely to be total reflected. This accordingly renders the light less likely to be extinct due to total reflection, thereby further enhancing light extraction efficiency of the LED.

Third Embodiment

Figure 7:
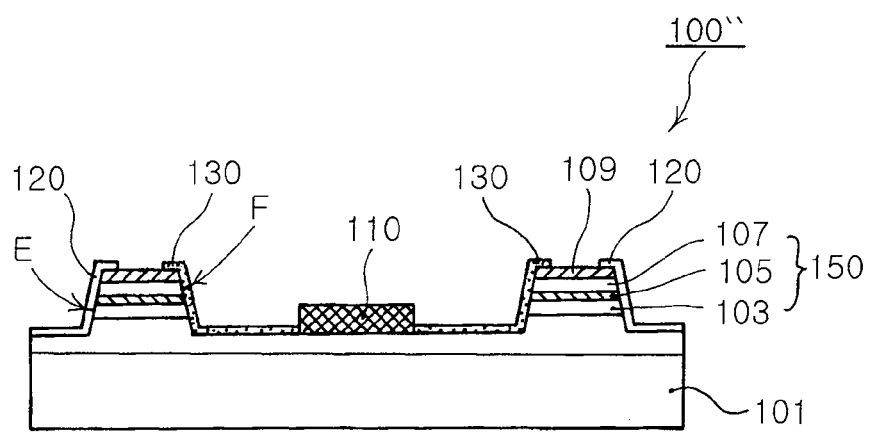
FIG. 7 is a side cross-sectional view illustrating a facet extraction LED according to a third embodiment of the invention.

FIG. 7 is a side cross-sectional view illustrating a facet extraction LED 100" according to a third embodiment of the invention. In this embodiment, two opposing facets of a ring-structured light emitting part are inclined. Referring to FIG. 7, an outer facet E and an inner facet F of the light emitting stack 150 are inclined with respect to a stacking direction of semiconductor layers 103, 105 and 107. Thus, the light emitting stack 150 is widened toward a substrate 101 into a cross-sectional shape of a trapezoid. In this fashion, the two facets of the light emitting stack 150 are inclined so that some portion of light reflected from the outer and inner facets E and F propagates toward the substrate 101. In a case where this facet extraction LED 100" is adopted for a flip chip LED, the outer and inner facets E and F can be inclined as just described thereby to further boost light extraction amount from the substrate 101 and light extraction efficiency of the LED (see FIG. 10).

Fourth Embodiment

Figure 8:
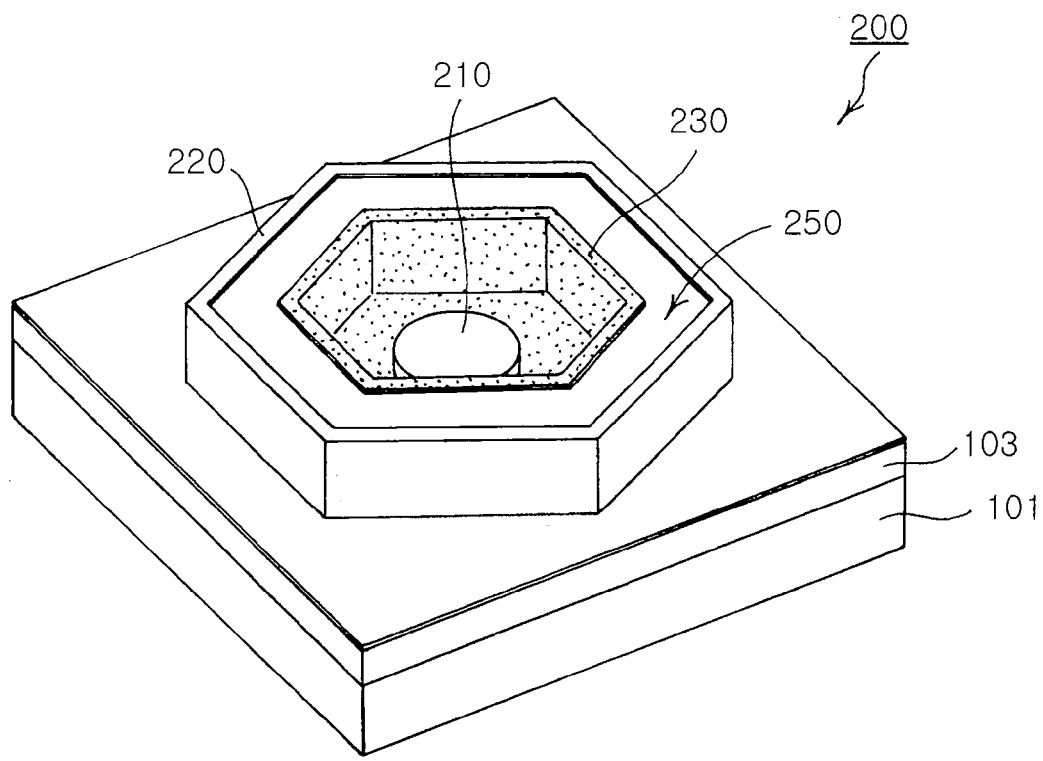
FIG. 8 is a perspective view illustrating a facet extraction LED according to a fourth embodiment of the invention.

FIG. 8 is a perspective view illustrating a facet extraction LED 200 according to a fourth embodiment of the invention. In this embodiment, a light emitting part is shaped as a hexagon. As shown in FIG. 8, in this embodiment, the light emitting part 250 formed on a substrate 101 features a ring structure. An anti-reflective film 220 is formed on an outer facet of the ring structure and a reflective film 230 is formed on an inner facet thereof. An n-electrode 210 is surrounded by the ring structure. However, the light emitting part 250 of the ring structure is shaped as not a circle but a hexagonal ring, unlike the aforesaid embodiment.

As shown in FIG. 8, even when the light emitting part 250 features a hexagonal ring structure instead of a circular ring structure, an outer peripheral length of the active layer on the outer facet is bigger than a distance between the outer facet, i.e., major light extraction face and the opposing inner facet. This ensures higher light extraction efficiency than a conventional facet extraction light emitting LED. The light emitting part 250 is shaped as a hexagonal ring but the invention is not limited thereto. For example, the light emitting part 250 may be configured as a polygonal ring structure such as an octagon or a decagon.

Fifth Embodiment

Figure 9:
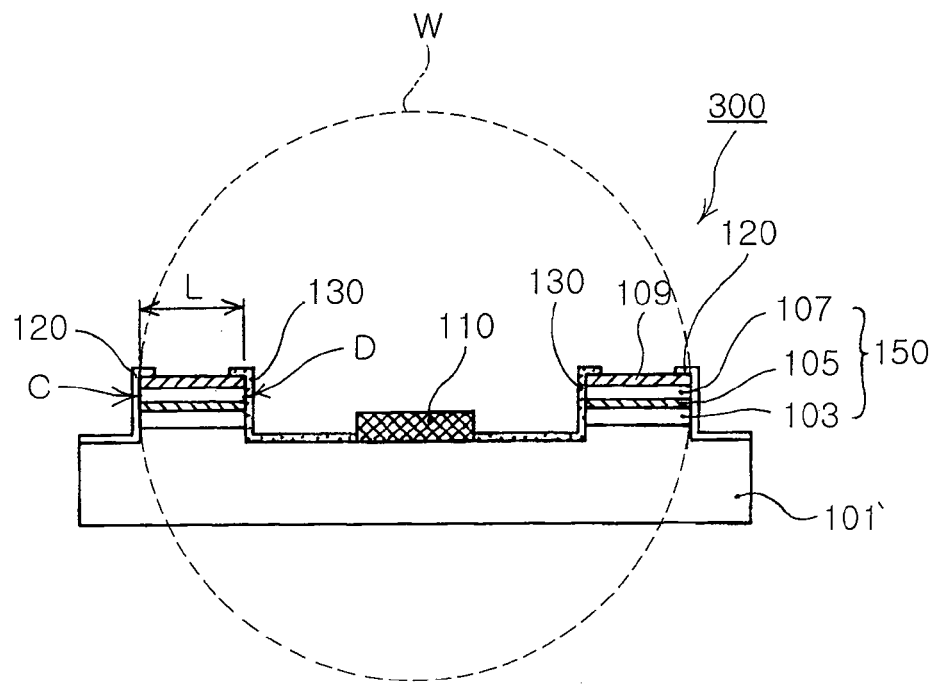
FIG. 9 is a side cross-sectional view illustrating a facet extraction LED according to a fifth embodiment of the invention.

FIG. 9 is a side cross-sectional view illustrating a facet extraction LED 300 according to a fifth embodiment of the invention. In this embodiment, an n-electrode 110 is surrounded by a light emitting stack 150 of a ring structure, and directly formed on a substrate 101'. As shown in FIG. 9, the n-electrode 110 of the facet extraction LED 300 is surrounded by the ring-structured light emitting stack 150 and notably in direct contact with the substrate 101'. In order to bring the n-electrode 110 in direct contact with the substrate 101', the substrate 101' is exposed when mesa-etching is performed to form the ring structure, and the n-electrode 110 is formed on the exposed substrate 100' (see FIG. 14). The substrate 101' needs to be conductive to electrically connect the n-electrode 110 with the substrate 101'.

In this embodiment, an outer peripheral length W of the active layer on the outer facet is bigger than a distance L between the outer and inner facets C and D. This increases an area ratio of the major light extraction face, i.e., outer facet C with respect to the other facet D, thereby causing light to propagate a short distance in a crystal. Thus as just described, this clearly assures improvement in light extraction efficiency and brightness.

In the aforesaid embodiments, the anti-reflective film 120 is formed on the outer facet C, R and E of the ring-structured light emitting stack 150 and the reflective film 130 is formed on the inner facet D and F thereof. But the invention is not limited thereto. For example, either of the anti-reflective film 120 and the reflective film 130 may be omitted. Alternatively, both of the anti-reflective film 120 and the reflective film 130 may be omitted (see reference sign 100" of FIG. 11).

Flip-Bonded LED

Figure 10:
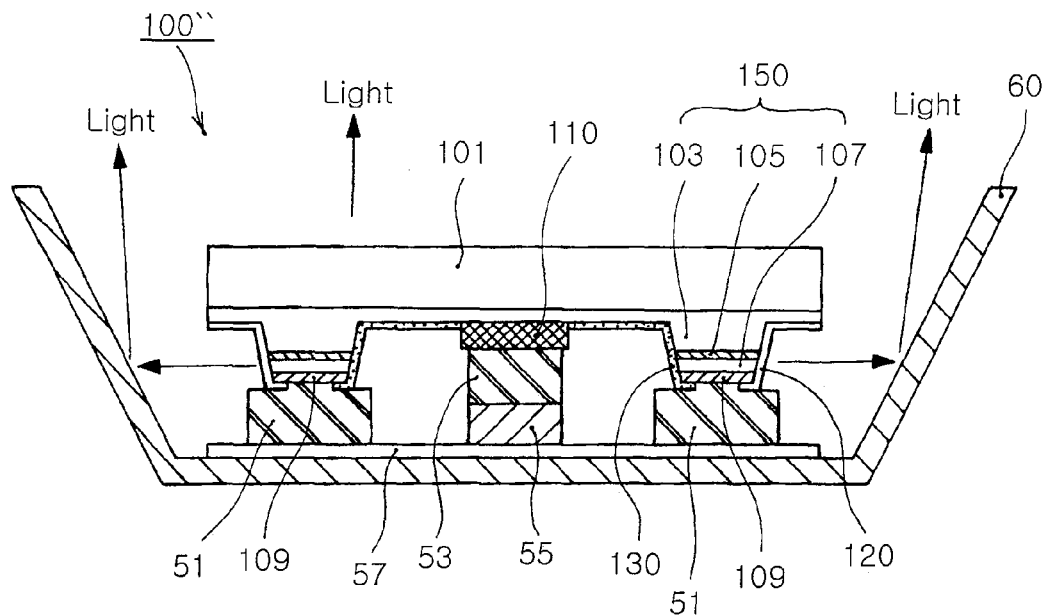
FIG. 10 illustrates a facet extraction LED mounted in a reflective cup of a package according to an embodiment of the invention.
Figure 11:
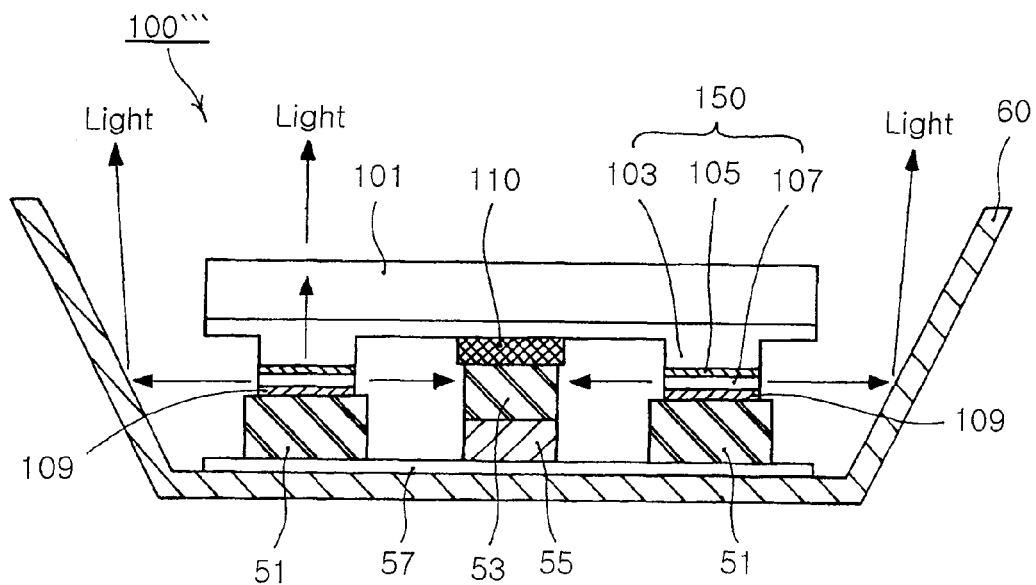
FIG. 11 illustrates a facet extraction LED mounted in a reflective cup of a package according to another embodiment of the invention.

FIGS. 10 and 11 illustrate a facet extraction LED mounted in a reflective cup of a package according to the aforesaid embodiments. Especially in FIGS. 10 and 11, the facet extraction LED is flip-chip bonded to a submount, i.e., the reflective cup of the package in this embodiment.

Referring to FIG. 10, electrodes of the facet extraction LED 100" are flipped over to face a bottom surface of the reflective cup 60 of the package so that a substrate 101 faces a direction where light emits. Here, preferably, the substrate 101 is a transparent substrate of e.g., sapphire or GaN. The p- and n-electrodes 109 and 110 are bonded onto a lower surface of the reflective cup 60 of the package by solder bump 51 and 53. In a case where the reflective cup 60 is made of a conductive material such as metal, an adequate insulating layer 57 is disposed on the bottom surface of the reflective cup 60, and an electrode pattern may be formed thereon. A metal pattern 55 made of Au may be interposed between the solder bump 53 and the bottom surface of the reflective cup.

As shown in FIG. 10, light extracted from a major light extraction face, i.e., an outer facet of the light emitting stack 150 is reflected onto a side of the reflective cup to travel upward, i.e., in a light extraction direction. In a case where the substrate 101 is a transparent substrate of e.g., sapphire or GaN, light is extracted from the outer facet of the light emitting stack 150 and from the substrate 101 as well. Notably, as shown in FIG. 10, a distance between the outer and inner facets of the light emitting stack 150 increases toward the substrate 101 so that some portion of light reflected from the outer and inner facets can be emitted toward the substrate 101.

In FIG. 11, a facet extraction LED 100''' is flip-chip bonded onto a bottom surface of a reflective cup 60. Especially, an anti-reflective film and a reflective film are not formed in the facet extraction LED 100'''. Therefore, light is radiated from not only an outer facet but also an inner facet of the ring-structured light emitting stack 150. Yet, light emitted from the inner facet may be absorbed or re-reflected by a bump 53 or a metal layer 55 which is centered in the package. In consequence, light emitted from the outer facet of the light emitting stack 150 and the substrate 101 (in case of a transparent substrate), is used as an actual output light.

Evidently, not only the facet extraction LED 100" and 100''' of this embodiment but also other facet extraction LEDs 100, 100', 200, and 300 according to other embodiments can be flip-chip bonded. FIGS. 10 and 11 employ the reflective cup 60 as an LED submount. But optionally, other types of submount may be utilized. Furthermore, the facet extraction LED can be mounted on the submount by a bonding method other than flip-chip bonding. For example, the LED of the invention can be mounted on the submount by wire bonding.

Manufacturing Method

Figure 13:
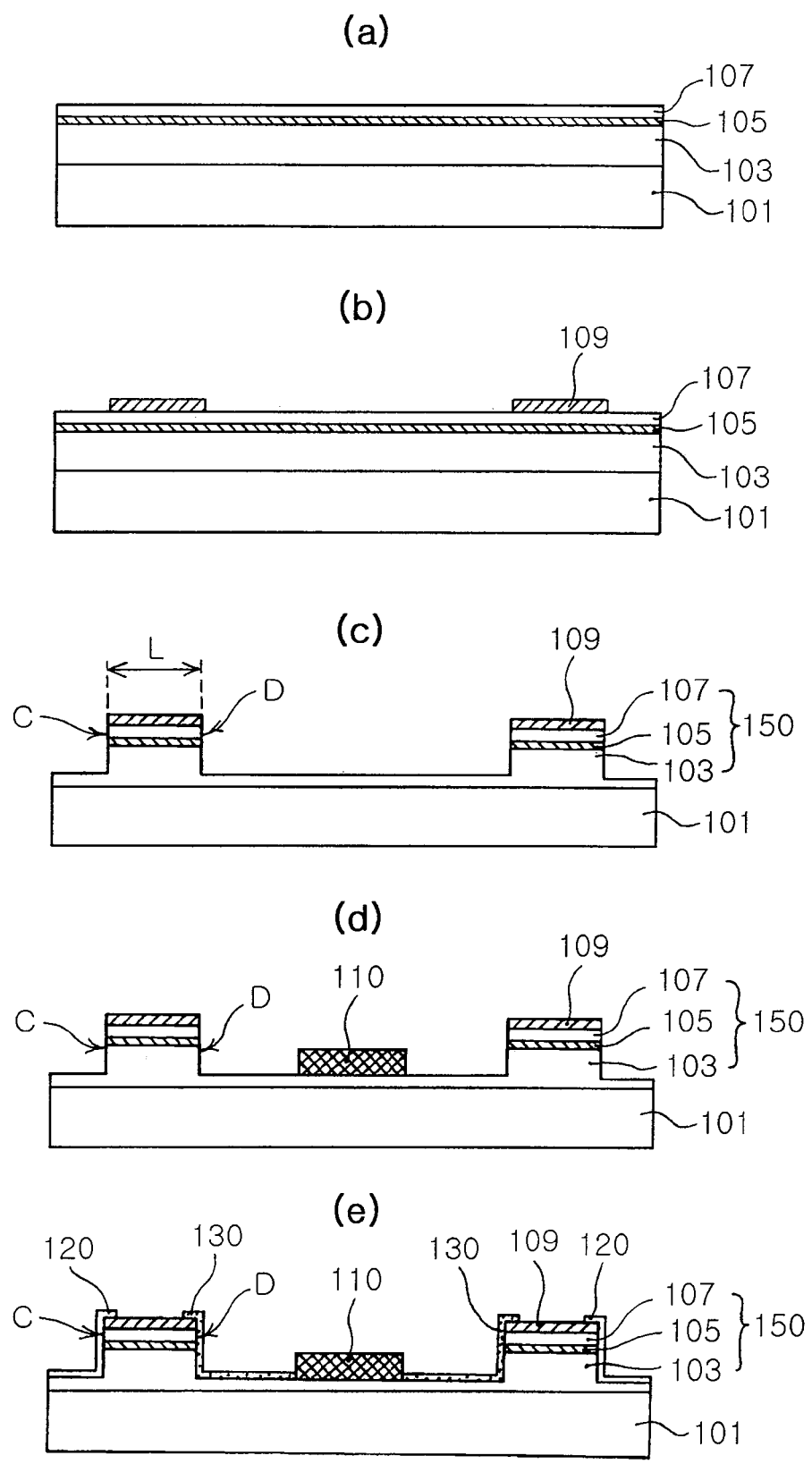
FIG. 13 is a side cross-sectional view for explaining a method for manufacturing a facet extraction LED according to an embodiment of the invention.

FIG. 13 is a side cross-sectional view for explaining a method for manufacturing a facet extraction LED according an embodiment of the invention. In this embodiment, an n-electrode is formed on an n-type semiconductor layer.

First, referring to FIG. 13 (a), the n-type semiconductor layer 103, an active layer 105 and a p-type semiconductor layer 107 are sequentially formed on an insulating or conductive substrate 101. The semiconductor layers 103, 105 and 107 may be made of a group III GAN-based nitride. The group III nitride semiconductor layers can be grown via e.g., Metal-Organic Chemical Vapor Deposition (MOCVD).

Next, as shown in FIG. 13 (b), a p-electrode 109 of a ring pattern is formed on the p-type semiconductor layer. The ring pattern may feature a circle (see FIG. 2) or a polygon such as a hexagon (see FIG. 8).

Subsequently, as shown in FIG. 13 (c), the p-electrode 109 or a mask (not illustrated) placed thereover is utilized as an etching mask to selectively etch the semiconductor layers 103, 105 and 107. This allows a light emitting stack 150 with a ring structure to be formed under the p-electrode 109 as shown. The ring structure of the light emitting stack 150 can be a circle or a polygon such as a hexagon as described above. To form the ring-structured light emitting stack 150 via etching, the n-type semiconductor layer 103 is partially etched in a thickness direction thereof. Especially, in a case where the substrate 101 is an insulating substrate of e.g., sapphire, the n-type semiconductor layer 103 should be partially etched in a thickness direction thereof in order to be made in contact with the n-electrode.

Thereafter, as shown in FIG. 13 (d), the n-electrode 10 is surrounded by the ring-structured light emitting stack 150. The n-electrode 110 is formed on the n-type semiconductor layer 103, surrounded by the light emitting stack 150. This allows the n-electrode 110 and the n-type semiconductor layer 103 to be electrically connected with each other.

Then, as shown in FIG. 13 (e), optionally, an anti-reflective film 120 is formed on an outer facet C of the ring-structured light emitting stack 150 and a reflective film 130 is formed on an inner facet D thereof. This accordingly produces the facet extraction LED according to an embodiment of the invention.

Figure 14:
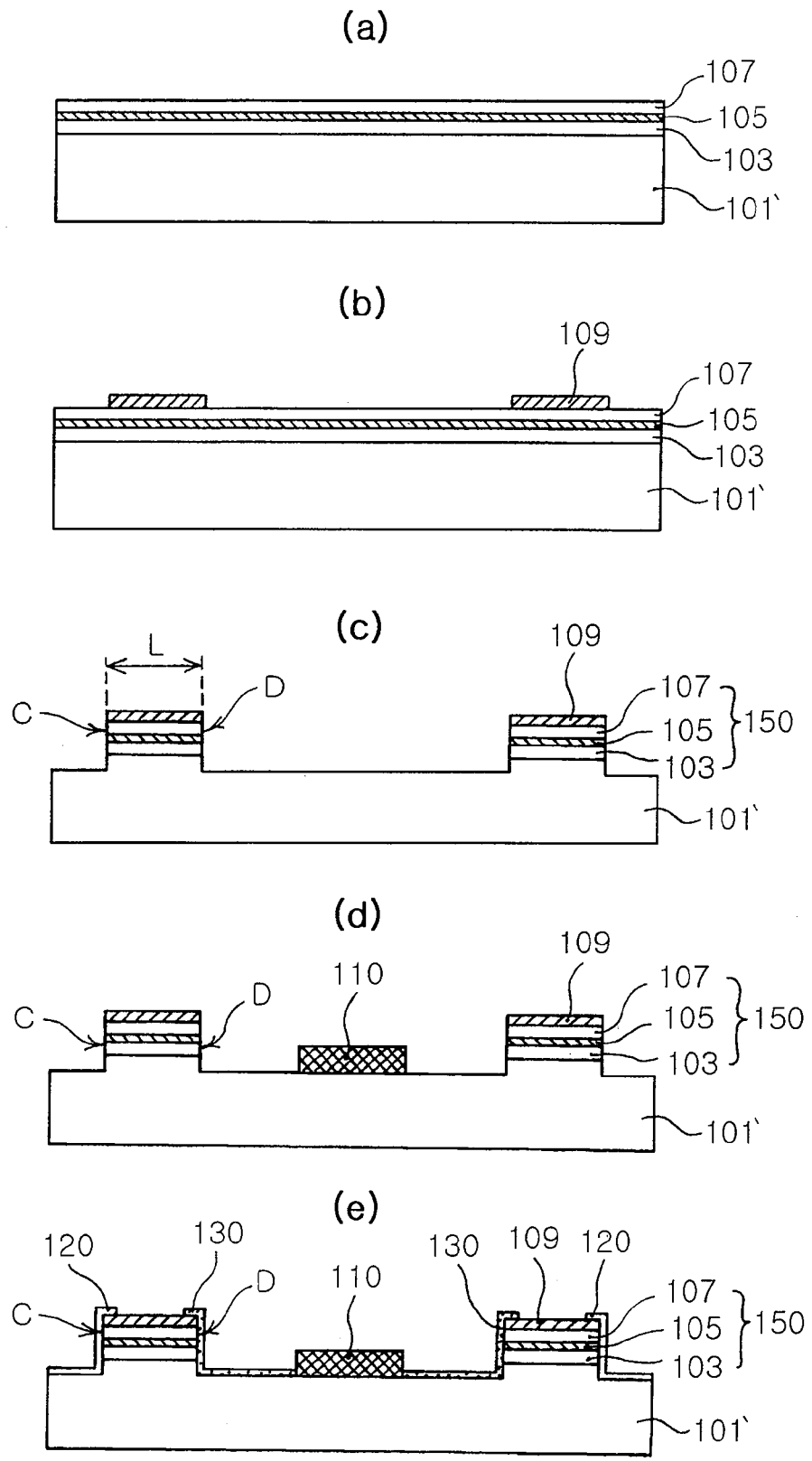
FIG. 14 is a side cross-sectional view for explaining a method for manufacturing a facet extraction LED according to another embodiment of the invention.

FIG. 14 is a side cross-sectional view for explaining a method for manufacturing a facet extraction LED according to another embodiment of the invention. In this embodiment, an n-electrode is directly formed on a conductive substrate. The manufacturing method of this embodiment can be applied to obtain the facet extraction LED 300 of FIG. 9.

First, referring to FIG. 14 (a), an n-type semiconductor layer 103, an active layer 105, and a p-type semiconductor layer 107 are sequentially formed on a conductive substrate 101' of e.g., GaN. Then, as shown in FIG. 14 (b), a p-electrode of a ring pattern is formed on the p-type semiconductor layer 107. Subsequently, as shown in FIG. 14 (c), the semiconductor layers 103, 105, and 107 are selectively etched to form a light emitting part 150 of a ring structure under the p-electrode 109. In this embodiment, to obtain the ring structure via selective etching, the n-type semiconductor layer is entirely etched to expose the conductive substrate 101'. Here, the conductive substrate 101' may be etched to a certain thickness.

Afterwards, as shown in FIG. 14 (d), an n-electrode 110 is surrounded by the ring-structured light emitting part 150 and directly formed on the conductive substrate 101'. This brings the n-electrode 110 in direct contact with the conductive substrate 101'. Then, as shown in FIG. 14 (e), optionally, an anti-reflective film 120 is formed on an outer facet C of the ring structure and a reflective film 130 is formed on an inner facet D thereof. This as a result produces the facet extraction LED having the n-electrode 110 in direct contact with the conductive substrate 101'.

As set forth above, according to exemplary embodiments of the invention, a light emitting part is shaped as a ring to increase an area ratio of a major light extraction face. This consequently increases light extraction amount from the light extraction face and light extraction efficiency of an entire device. In addition, this renders light less likely to be total reflected on the light extraction face, thereby further enhancing light extraction efficiency and brightness.

While the present invention has been shown and described in connection with the preferred embodiments, it will be apparent to those skilled in the art that modifications and variations can be made without departing from the spirit and scope of the invention as defined by the appended claims.

What is claimed is:

1. A method for manufacturing a light emitting diode comprising:
   sequentially forming an n-type semiconductor layer, an active layer and a p-type semiconductor layer on a substrate;
   forming a p-electrode with a ring pattern on the p-type semiconductor layer;
   selectively etching the p-type semiconductor layer, the active layer and the n-type semiconductor layer to form a light emitting part of a ring structure under the p-electrode, the ring structure having an outer facet and an inner facet;
   forming an n-electrode to be surrounded by the light emitting part; and
   forming a reflective film on the inner facet of the ring structure.

2. The method according to claim 1, wherein the step of forming the light emitting part of the ring structure comprises partially etching a portion of the n-type semiconductor layer, in a thickness direction, in such a fashion that a remaining portion of the etched n-type semiconductor layer portion is surrounded by the light emitting part.

3. The method according to claim 2, wherein the n-electrode is formed on the remaining portion of the n-type semiconductor layer surrounded by the light-emitting part.

4. The method according to claim 1, wherein the substrate comprises a conductive substrate, and
   wherein the step of forming the light emitting part of the ring structure comprises entirely etching a portion of the n-type semiconductor layer, in a thickness direction, so that the portion of the n-type semiconductor layer is completely removed in a region surrounded by the light emitting part.

5. The method according to claim 4, wherein the n-electrode is surrounded by the light emitting part and is in direct contact with the substrate.

6. The method according to claim 1, further comprising forming an anti-reflection film on the outer facet of the ring structure.

7. A method for manufacturing a light emitting diode comprising:
   sequentially forming an n-type semiconductor layer, an active layer and a p-type semiconductor layer on a substrate;
   forming a p-electrode with a ring pattern on the p-type semiconductor layer;
   selectively etching the p-type semiconductor layer, the active layer and the n-type semiconductor layer to form a light emitting part of a ring structure under the p-electrode, the ring structure having an outer facet and an inner facet;

forming an n-electrode to be surrounded by the light emitting part; and forming a anti-reflective film on the outer facet of the ring structure.

8. A method for manufacturing a light emitting diode comprising:

sequentially forming an n-type semiconductor layer, an active layer and a p-type semiconductor layer on a substrate;

forming a p-electrode with a ring pattern on the p-type semiconductor layer;

selectively etching the p-type semiconductor layer, the active layer and the n-type semiconductor layer to form a light emitting part of a ring structure under the p-electrode, the ring structure having an outer facet and an inner facet; and forming an n-electrode to be surrounded by the light emitting part, wherein the substrate comprises a conductive substrate, and wherein the step of forming the light emitting part of the ring structure comprises entirely etching a portion of the n-type semiconductor layer, in a thickness direction, so that the portion of the n-type semiconductor layer is completely removed in a region surrounded by the light emitting part.

9. The method according to claim 8, wherein the n-electrode is surrounded by the light emitting part and is in direct contact with the substrate.

* * * * *